United States Patent
Murasumi et al.

(10) Patent No.: US 7,678,183 B2
(45) Date of Patent: Mar. 16, 2010

(54) ELECTROLESS PALLADIUM PLATING BATH AND ELECTROLESS PALLADIUM PLATING METHOD

(75) Inventors: Akihiko Murasumi, Hirakata (JP); Seigo Kurosaka, Hirakata (JP); Hiromu Inagawa, Hirakata (JP); Yukinori Oda, Hirakata (JP)

(73) Assignee: C. Uyemura & Co., Ltd., Osaka-shi (JP)

( * ) Notice: Subject to any disclaimer, the term of this patent is extended or adjusted under 35 U.S.C. 154(b) by 27 days.

(21) Appl. No.: 12/067,662

(22) PCT Filed: Sep. 22, 2006

(86) PCT No.: PCT/JP2006/318827

§ 371 (c)(1),
(2), (4) Date: Mar. 21, 2008

(87) PCT Pub. No.: WO2007/037176

PCT Pub. Date: Apr. 5, 2007

(65) Prior Publication Data

US 2009/0133603 A1     May 28, 2009

(30) Foreign Application Priority Data

Sep. 27, 2005    (JP) .............................. 2005-279180

(51) Int. Cl.
*C23C 18/44* (2006.01)
(52) U.S. Cl. ..................................... 106/1.24; 106/1.28
(58) Field of Classification Search ................ 106/1.24, 106/1.28
See application file for complete search history.

(56) References Cited

U.S. PATENT DOCUMENTS

| | | | | |
|---|---|---|---|---|
| 4,424,241 A | * | 1/1984 | Abys | 106/1.24 |
| 4,804,410 A | * | 2/1989 | Haga et al. | 106/1.28 |
| 5,258,062 A | * | 11/1993 | Nakazawa et al. | 106/1.23 |
| 5,882,736 A | * | 3/1999 | Stein et al. | 106/1.24 |
| 2009/0044720 A1 | * | 2/2009 | Kojima et al. | 106/1.24 |
| 2009/0081369 A1 | * | 3/2009 | Aiba et al. | 106/1.24 |

FOREIGN PATENT DOCUMENTS

| | | |
|---|---|---|
| JP | 46 26764 | 8/1971 |
| JP | 53 37045 | 10/1978 |
| JP | 62 124280 | 6/1987 |
| JP | 3 215678 | 9/1991 |
| JP | 5 39580 | 2/1993 |
| JP | 8 269727 | 10/1996 |
| JP | 10 195666 | 7/1998 |
| JP | 10 195667 | 7/1998 |
| JP | 2001 3179 | 1/2001 |

OTHER PUBLICATIONS

Machine English translation of JP 2001/003179; Jan. 2001.*
Machine English translation of JP 10/195667; Jul. 1998.*
Machine English translation of JP 07/062549; Mar. 1995.*

* cited by examiner

*Primary Examiner*—Helene Klemanski
(74) *Attorney, Agent, or Firm*—Oblon, Spivak, McClelland, Maier & Neustadt, L.L.P.

(57) ABSTRACT

Disclosed is an electroless palladium plating bath containing a palladium compound, at least one complexing agent selected from ammonia and amine compounds, at least one reducing agent selected from phosphinic acid and phosphinates, and at least one unsaturated carboxylic acid compound selected from unsaturated carboxylic acids, unsaturated carboxylic acid anhydrides, unsaturated carboxylates and unsaturated carboxylic acid derivatives. Such an electroless palladium plating bath has high bath stability, and decomposition of the bath hardly occurs. Consequently, the electroless palladium plating bath of the present invention has a longer bath life than conventional electroless palladium plating baths. In addition, this electroless palladium plating bath enables to obtain excellent solder bonding characteristics and wire bonding characteristics since it does not affect plating film characteristics even when it is used for a long time.

11 Claims, No Drawings

ELECTROLESS PALLADIUM PLATING BATH AND ELECTROLESS PALLADIUM PLATING METHOD

TECHNICAL FIELD

This invention relates to an electroless palladium plating bath having high storage stability and good bath stability during continued use and capable of withstanding industrial use, and also to an electroless palladium plating method making use of the bath.

BACKGROUND ART

In packaging steps for printed circuit boards or electronic parts or components, electroless nickel/displacement gold plating has been widely used for years in surface treatments for applications where high reliability is required.

As displacement gold plating causes gold to deposit by making use of a difference in oxidation reduction potential between nickel as a substrate and a plating bath, gold penetrates into the nickel so that points of corrosion occur by oxidation (leaching). These points of corrosion by the oxidation may act as an inhibitory factor upon connecting Sn in a solder layer with Ni in the course of subsequent solder reflow, leading to a problem that the joint properties such as strength may be lowered.

When electroless nickel/displacement gold plating film is used at a site to be subjected to wire bonding, heat treatment is conducted after the plating treatment. By this heat treatment, however, Ni is caused to diffuse over the surface of the Au film so that the percentage of success in wire bonding is reduced. This reduction in the percentage of success in wire bonding is, therefore, prevented by further applying an electroless Au plating onto the electroless nickel/displacement metal film to increase the thickness of the Au film such that the diffusion of Ni over the Au film can be avoided. This countermeasure, however, involves a cost problem.

Keeping in step with the promotion of lead-free movement in recent years, on the other hand, there is a trend toward using new alloys composed principally of tin (for example, Sn—Ag and Sn—Ag—Cu) for joining without using tin-lead alloys. This trend is, however accompanied by a problem in that compared with conventional tin-lead eutectic solder, such new alloys result in the application of greater heat load during solder joining and hence in reduced joint properties.

It has, therefore, become a practice in recent years to avoid the above-described problem with a palladium film interposed between an electroless nickel plating layer and a displacement gold plating layer by electroless palladium plating. As reducing agents in electroless palladium plating baths for use in the above-described practice, phosphinic acid compounds, phosphonic acid compounds, formic acid compounds, boron hydride compounds and the like can be employed. In particular, however, palladium film obtained from an electroless palladium plating bath containing phosphinic acid or a phosphinate salt such as sodium phosphinate have better solder joint properties and wire bonding properties than palladium film obtained from an electroless palladium plating bath making use of a reducing agent other than that mentioned above.

Since a long time ago, there have been proposed numerous electroless palladium plating baths with phosphinate compounds contained as reducing agents (see Japanese Patent Publication No. Sho 46-26764 (Patent Document 1)). These plating baths are, however, accompanied by a problem in that they are poor in bath stability and are decomposed in short time. It has, therefore, been proposed to incorporate an additive with a view to improving the bath stability (Japanese Patent Laid-open No. Sho 62-124280 (Patent Document 2), Japanese Patent Publication No. Sho 53-37045 (Patent Document 3), Japanese Patent Laid-open No. Hei 5-39580 (Patent Document 4), Japanese Patent Laid-open No. Hei 8-269727 (Patent Document 5)). However, these proposals have not led to improvements in storage stability and the bath stability during continued use to such extent as making the baths withstandable their use on an industrial scale in the field of electronic industry or the like.

Patent Document 1:
Japanese Patent Publication No. Sho 46-26764
Patent Document 2:
Japanese Patent Laid-open No. Sho 62-124280
Patent Document 3:
Japanese Patent Publication No. Sho 53-37045
Patent Document 4:
Japanese Patent Laid-open No. Hei 5-39580
Patent Document 5:
Japanese Patent Laid-open No. Hei 8-269727

DISCLOSURE OF THE INVENTION

Problems to be Solved by the Invention

With the foregoing circumstances in view, the present invention has as objects thereof the provision of an electroless palladium plating bath having storage stability high enough to withstand industrial use and good bath stability even during continued use and also an electroless palladium plating method making use of the bath.

Means for Solving the Problems

The present inventors have proceeded with an extensive investigation to solve the above-described problems. As a result, it was found that the stability of an electroless palladium plating bath, which contains a phosphinic acid compound such as phosphinic acid or a phosphinate salt as a reducing agent, can be pronouncedly improved by adding as a stabilizer an unsaturated carboxylic acid compound selected from unsaturated carboxylic acids, unsaturated carboxylic acid anhydrides, unsaturated carboxylate salts and unsaturated carboxylic acid derivatives and also that the electroless palladium plating bath can form a palladium film having excellent solder joining properties and wire bonding properties even when the bath is used over a long time. Those findings have then led to the completion of the present invention.

The present invention, therefore, provides an electroless palladium plating bath including a palladium compound, at least one complexing agent selected from ammonia and amine compounds, at least one reducing agent selected from phosphinic acid and phosphinate salts, and at least one unsaturated carboxylic acid compound selected from unsaturated carboxylic acids, unsaturated carboxylic acid anhydrides, unsaturated carboxylate salts and unsaturated carboxylic acid derivatives, and also an electroless palladium plating method including immersing a workpiece in the electroless palladium plating bath to form an electroless palladium plating film on the workpiece.

As the unsaturated carboxylic acids, unsaturated carboxylic acid anhydrides, unsaturated carboxylate salts and unsaturated carboxylic acid derivatives, acrylic acid, methacrylic acid, maleic acid, fumaric acid, itaconic acid, citraconic acid and mesaconic acid, and anhydrides, salts and derivatives thereof are preferred.

BENEFITS OF THE INVENTION

The electroless palladium plating bath according to the present invention is high in bath stability, hardly undergoes decomposition, and is longer in bath life than conventional electroless palladium plating baths. Moreover, the electroless palladium plating bath provides excellent solder bonding characteristics and wire bonding characteristics even when used over a long time without affecting plating film characteristics.

BEST MODE FOR CARRYING OUT THE INVENTION

The present invention will hereinafter be described in further detail.

The electroless palladium plating bath according to the present invention contains a palladium compound, at least one complexing agent selected from ammonia and amine compounds, at least one phosphinic acid compound selected as a reducing agent from phosphinic acid and phosphinate salts, and at least one unsaturated carboxylic acid compound selected from unsaturated carboxylic acids, unsaturated carboxylic acid anhydrides, unsaturated carboxylate salts and unsaturated carboxylic acid derivatives.

The palladium compound can be any palladium compound insofar as it is soluble in water. Usable examples include palladium chloride, palladium sulfate, palladium acetate, palladium nitrate, and tetraaminepalladium hydrochloride. Its content may desirably be set at from 0.001 to 0.5 mol/L, with 0.005 to 0.1 mol/L being particularly desired, in terms of the concentration of palladium. An excessively low content may result in a lowered plating rate, while an unduly high content may lead to a film of reduced physical properties.

As a reducing agent, at least one compound selected from phosphinic acid and phosphinate salts is contained. Its content may preferably be set at from 0.001 to 5 mol/L, with 0.2 to 2 mol/L being particularly preferred. An excessively low content may result in a lowered deposition rate, while an unduly high content may lead to an unstable bath. As the phosphinate compounds, sodium phosphinate, ammonium phosphinate and the like can be exemplified.

As a complexing agent, at least one compound selected from ammonia and amine compounds is also contained. Its content may preferably be set at from 0.001 to 10 mol/L, with 0.1 to 2 mol/L being particularly preferred. An excessively low content may result in a bath of reduced stability, while an unduly high content may result in a lowered plating rate. As the amine compounds, methylamine, dimethylamine, trimethylamine, benzylamine, methylenediamine, ethylenediamine, tetramethylenediamine, diethylenetriamine, EDTA, EDTA sodium, EDTA potassium, glycine and the like can be exemplified. They can be used ether singly or in combination.

The electroless palladium plating bath according to the present invention contains, in addition to the above-descried components, at least one unsaturated carboxylic acid compound selected from unsaturated carboxylic acids, unsaturated carboxylic acid anhydrides, unsaturated carboxylate salts and unsaturated carboxylic acid derivatives. Specific examples of the unsaturated carboxylic acids include acrylic acid, propiolic acid, crotonic acid, isocrotonic acid, methacrylic acid, maleic acid, fumaric acid, citraconic acid, trans-2-butene-1,4-dicarboxylic acid, itaconic acid, tetrolic acid, aconitic acid, muconic acid, sorbic acid, tiglic acid, angelic acid, senecionic acid, glutaconic acid, mesaconic acid, oleic acid, linoleic acid, cinnamic acid, and the like. As the unsaturated carboxylic acid anhydrides and unsaturated carboxylate salts, acid anhydrides and salts, such as the sodium salts and ammoniums salts, of the above-mentioned unsaturated carboxylic acids can be exemplified. Further, as the unsaturated carboxylic acid derivatives, ethyl methacrylate, phenyl methacrylate, isobutyl acrylate, methyl propiolate, maleic hydrazide and the like can be exemplified. These unsaturated carboxylic acids, unsaturated carboxylic acid anhydrides, unsaturated carboxylate salts and unsaturated carboxylic acid derivatives can be used either singly or in combination.

Particularly preferred examples of such unsaturated carboxylic acids, unsaturated carboxylic acid anhydrides, unsaturated carboxylate salts and unsaturated carboxylic acid derivatives include acrylic acid, methacrylic acid, maleic acid, fumaric acid, itaconic acid, citraconic acid and mesaconic acid, and their anhydrides, salts and derivatives. The use of one or more of unsaturated carboxylic acid compounds makes it possible to provide excellent bath stability and to obtain palladium films having superb solderability, wire bondability and the like.

The content of the unsaturated carboxylic acid compound may range preferably from 0.001 to 10 mol/L, more preferably from 0.01 to 0.5 mol/L. An excessively low content cannot bring about the sufficient effect for the stability of the plating bath, while an unduly high content tends to lower the plating rate.

The pH of the plating bath according to the present invention may range preferably from 4 to 10, more preferably from 6 to 8. An excessively low pH leads to a plating bath of reduced stability, while an unduly high pH results in an increased plating rate, thereby tending to reduce solder joining properties and wire bonding properties.

The above-mentioned electroless palladium plating bath can be suitably used as bonding plating or the like for electronic parts. When conducting plating with the electroless palladium plating bath, a workpiece is immersed in the plating bath. As the material of the workpiece, a metal having catalytic property for the reductive deposition of an electroless palladium plating film, such as iron, cobalt, nickel, copper, tin, silver, gold, platinum or palladium or an alloy thereof can be exemplified. In the case of a metal having no catalytic property, plating may be conducted after conducting so-called galvanic initiation (in other words, applying electricity to a workpiece until reductive deposition takes place) or after forming a plating film of the above-described metal having catalytic property. To glass, ceramics, plastics or a metal which does not have the above-described catalytic property, plating can be performed after causing metal catalyst nuclei such as palladium nuclei to deposit in a manner known in the art.

The electroless palladium plating bath according to the present invention can form a palladium plating film on a nickel film formed by electroless nickel plating or the like. The formation of a gold plating film on the palladium plating film by displacement gold plating makes it possible, without increasing the amount of costly gold to be used, to avoid the problem of a reduction in the solderability or wire bondability of an electroless nickel film/displacement gold plating film which has conventionally been employed for the surface treatment of a printed circuit board or electronic part. The electroless palladium plating bath according to the present invention is, therefore, particularly useful for such applications. In these applications, the thickness of each palladium plating film may preferably range from 0.001 to 0.5 μm.

It is to be noted that the plating temperature may desirably range from 30 to 80° C., with from 40 to 70° C. being particularly preferred. Further, the plating bath may be stirred as needed.

EXAMPLES

The present invention will hereinafter be described specifically based on Examples and Comparative Examples, although the present invention shall not be limited to the following Examples.

Examples 1 to 8, Comparative Examples 1 to 5

Electroless palladium plating baths of the compositions shown in Table 2 and Table 3 were prepared, and the plating performance of the plating baths, properties of the resulting plating films, and the stability of the plating baths were evaluated by the methods to be described below. In Examples 1, 2, 5 and 6, the properties of plating films were also evaluated by using the plating baths after conducting continuous plating tests at 50° C. by the method to be described below. The results are shown in Tables 2 and 3.

Appearances of Plating Films

The treatments (1) to (5) [pretreatment] and the treatments (6) to (8) [plating treatment], which are shown in Table 1, were applied to copper sheets (size: 10 cm×20 cm, thickness: 0.1 mm), and the appearances of the resulting plating films were visually evaluated. Each plating film was evaluated "good" when it was free of unevenness in appearance, but was evaluated "poor" when it had an uneven appearance.

respectively. It is to be noted that upon elapsed time of every two hours, a weight loss of palladium in each plating bath was replenished.

80° C. Heating Test

Each plating bath (500 mL) sealed in a polyethylene-made vessel was stored in a constant-temperature chamber maintained at 80° C.

Room-Temperature Shelf Test

Each plating bath (500 mL) sealed in a polyethylene-made vessel was stored at room temperature.

Solderability

Under each condition, twenty samples were evaluated by "BOND TESTER SERIES 4000" manufactured by Dage Precision Industries, Inc. Each plating bath was evaluated "good" when cut-off took place at the soldered part without being ruptured or cut off at the part of an alloy layer, but was evaluated "poor" when the part of the alloy layer was also ruptured or cut off at least at a part thereof. It is to be noted that measurement conditions were set as will be described below.

[Measurement Conditions]

Measurement method: Ball pull test

Substrate: BGA substrate (pad diameter: φ 0.5 mm) manufactured by C. UYEMURA & CO., LTD.

Solder ball: Sn-3.0Ag-0.5Cu (diameter: +0.6 mm) manufactured by Senju Metal Industry Co., Ltd.

Reflow system: "MULTI-REFLOW" manufactured by TAMURA CORPORATION

Reflow conditions: Top 260° C.

Reflow cycle(s): 1 cycle and 5 cycles.

TABLE 1

| | Treatment | | Chemical solution | Temp. | Treatment time |
|---|---|---|---|---|---|
| Pre-treatment | (1) Cleaner treatment | ACL-009 | Product of C. UYEMURA & CO., LTD. | 50° C. | 5 min |
| | (2) Soft etching | 100 g/L SPS | — | 25° C. | 2 min |
| | (3) Acid cleaning | 10% $H_2SO_4$ | — | Room temp. | 1 min |
| | (4) Pre-dipping | 3% $H_2SO_4$ | — | Room temp. | 1 min |
| | (5) Activator treatment | MNK-4 | Product of C. UYEMURA & CO., LTD. | 30° C. | 2 min |
| Plating treatment | (6) Electroless Ni—P plating | NPR-4 | Product of C. UYEMURA & CO., LTD. | 80° C. | 30 min |
| | (7) Electroless Pd plating | | See Table 2 and Table 3 | | 5 min |
| | (8) Displacement Au plating | TAM-55 | Product of C. UYEMURA & CO., LTD. | 80° C. | 10 min |

Deposition Rate

The treatments (1) to (6) shown in Table 1 were applied to copper sheets (size: 10 cm×20 cm, thickness: 0.1 mm), and were then immersed for 60 minutes in the electroless palladium plating baths (1 L) shown in Tables 2 and 3, respectively. From the thicknesses of the resulting palladium films, deposition rates were calculated.

50° C. Continuous Plating Test

The treatments (1) to (5) shown in Table 1 were applied to copper sheets (size: 10 cm×20 cm, thickness: 0.1 mm). After Ni—P films of 5 μm thick were formed using the electroless Ni—P plating bath (6) in Table 1, the copper sheets were immersed in the electroless palladium plating baths shown in Table 2 and Table 3 to continuously form palladium films, Flux: "529D-1 (RMA TYPE)" manufactured by Senju Metal Industry Co., Ltd.

Test speed: 170 μm/sec.

Aging after solder mounting: 2 to 3 hours.

Wire Bondability

Wire bonding was performed by "4524A WIRE PULL TESTER" manufactured by K&S Wire Products, Inc. Under each condition, ten samples were evaluated by "BOND TESTER SERIES 4000" manufactured by Dage Precision Industries, Inc. Each plating bath was evaluated "good" when the wire itself was cut off without being ruptured or cut off at the first or second bonded part, but was evaluated "poor" when the first or second bonded part was also ruptured or cut off at least at a part thereof. It is to be noted that measurement conditions were set as will be described below.

[Measurement Conditions]
Capillary: 40472-0010-3201
Wire: 1 mil-gold
Stage temperature: 180° C.
Ultrasonic wave (mW): 25 (first), 115 (second)
Bonding time (msec): 36 (first), 136 (second)
Pulling force (gf): 44 (first), 70 (second)
Step (length from the first to the second): 0.812 mm
Measurement method: Wire pull test
Substrate: BGA substrate manufactured by C. UYEMURA & CO., LTD.
Test speed: 170 μm/sec.

TABLE 2

| | | | Example | | | | | | | |
|---|---|---|---|---|---|---|---|---|---|---|
| | | | 1 | 2 | 3 | 4 | 5 | 6 | 7 | 8 |
| Electroless palladium plating bath | Pd salt | Palladium chloride (mol/L) | 0.03 | 0.03 | 0.03 | 0.03 | | | | |
| | | Tetraamine palladium·chloride (mol/L) | | | | | 0.005 | 0.005 | 0.005 | 0.005 |
| | Complexing agent | Ethylenediamine (mol/L) | 0.4 | 0.4 | 0.4 | 0.4 | 0.4 | 0.4 | 0.4 | 0.4 |
| | | EDTA (mol/L) | 0.03 | | 0.03 | | 0.03 | | 0.03 | |
| | | Glycine (mol/L) | | 0.03 | | 0.03 | 0.03 | 0.03 | | 0.03 |
| | | Ammonia (28%) (mol/L) | | | | | | | | |
| | Reducing agent | Sodium phosphinate (mol/L) | 0.2 | 0.2 | 0.2 | 0.2 | 0.2 | 0.2 | 0.2 | |
| | | Ammonium phosphinate (mol/L) | | | | | | | | 0.2 |
| | Unsaturated carboxylic acid | Acrylic acid (mol/L) | 0.3 | | | | | | | |
| | | Methacrylic acid (mol/L) | | 0.3 | | | | | | |
| | | Maleic acid (mol/L) | | | 0.2 | | | | | |
| | | Fumaric acid (mol/L) | | | | 0.2 | | | | |
| | | Itaconic acid (mol/L) | | | | | 0.2 | | | |
| | | Citraconic acid (mol/L) | | | | | | 0.2 | | |
| | | Mesaconic acid (mol/L) | | | | | | | 0.2 | |
| | | Cinnamic acid (mol/L) | | | | | | | | 0.2 |
| | Malic acid (mol/L) | | | | | | | | | |
| | Acetic acid (mol/L) | | | | | | | | | |
| | Thioglycolic acid (mg/L) | | | | | | | | | |
| | Sodium thiosulfate (mg/L) | | | | | | | | | |
| | Temperature (° C.) | | 50 | 50 | 50 | 50 | 50 | 50 | 50 | 50 |
| | pH | | 8 | 8 | 8 | 8 | 8 | 8 | 8 | 8 |
| Plating film | Deposition rate (μm/hr) | Fresh solution | 0.4 | 0.4 | 0.5 | 0.5 | 0.7 | 0.6 | 0.6 | 0.7 |
| | | After 50-hr continuous plating test | 0.4 | 0.4 | — | — | 0.7 | 0.6 | — | — |
| | Appearance of plating | Fresh solution | Good | Good | Good | Good | Good | Good | Good | Good |
| | | After 50-hr continuous plating test | Good | Good | — | — | Good | Good | — | — |
| | Solderability | Fresh solution | Good | Good | Good | Good | Good | Good | Good | Good |
| | | After 50-hr continuous plating test | Good | Good | — | — | Good | Good | — | — |
| | Wire bondability | Fresh solution | Good | Good | Good | Good | Good | Good | Good | Good |
| | | After 50-hr continuous plating test | Good | Good | — | — | Good | Good | — | - |
| Bath stability | 50° C. continuous plating | | Remained free from decomposition even after 50 hours | | | | | | | |
| | 80° C. heating | | Remained free from decomposition even after 30 hours | | | | | | | |
| | Room-temperature shelfing | | Remained unchanged for 6 months | | | | | | | |

TABLE 3

| | | | Comparative Example | | | | |
|---|---|---|---|---|---|---|---|
| | | | 1 | 2 | 3 | 4 | 5 |
| Electroless palladium plating bath | Pd salt | Palladium chloride (mol/L) | 0.03 | | | 0.01 | |
| | | Tetraamine palladium·chloride (mol/L) | | 0.005 | 0.005 | | 0.005 |
| | Complexing agent | Ethylenediamine (mol/L) | 0.4 | 0.4 | 0.4 | | 0.4 |
| | | EDTA (mol/L) | | 0.03 | | 0.01 | |
| | | Glycine (mol/L) | | | 0.03 | | |
| | | Ammonia (28%) (mol/L) | | 50 | | 200 | |
| | Reducing agent | Sodium phosphinate (mol/L) | 0.2 | | 0.2 | 0.08 | 0.2 |
| | | Ammonium phosphinate (mol/L) | | 0.2 | | | |

TABLE 3-continued

| | | | Comparative Example | | | | |
|---|---|---|---|---|---|---|---|
| | | | 1 | 2 | 3 | 4 | 5 |
| | Unsaturated carboxylic acid | Acrylic acid (mol/L) | | | | | |
| | | Methacrylic acid (mol/L) | | | | | |
| | | Maleic acid (mol/L) | | | | | |
| | | Fumaric acid (mol/L) | | | | | |
| | | Itaconic acid (mol/L) | | | | | |
| | | Citraconic acid (mol/L) | | | | | |
| | | Mesaconic acid (mol/L) | | | | | |
| | | Cinnamic acid (mol/L) | | | | | |
| | Malic acid (mol/L) | | | 0.08 | | | |
| | Acetic acid (mol/L) | | | | 0.1 | | |
| | Thioglycolic acid (mg/L) | | | | | 20 | |
| | Sodium thiosulfate (mg/L) | | | | | | 50 |
| | Temperature (° C.) | | 50 | 50 | 50 | 50 | 50 |
| | pH | | 8 | 8 | 8 | 8 | 8 |
| Plating film | Deposition rate (μm/hr) | Fresh solution | 0.5 | 0.5 | 0.5 | 0.4 | 1.8 |
| | | After 50-hr continuous plating test | — | — | — | — | — |
| | Appearance of plating | Fresh solution | Good | Good | Good | Good | Good |
| | | After 50-hr continuous plating test | — | — | — | — | — |
| | Solderability | Fresh solution | Good | Good | Good | Good | Poor |
| | | After 50-hr continuous plating test | — | — | — | — | — |
| | Wire bondability | Fresh solution | Good | Good | Good | Good | Good |
| | | After 50-hr continuous plating test | — | — | — | — | — |
| Bath stability | 50° C. continuous plating | | Decomposed 2 hours later | Decomposed 2 hours later | Decomposed 2 hours later | Decomposed 2 hours later | Decomposed 2 hours later |
| | 80° C. heating | | Decomposed 4 hours later | Decomposed 4 hours later | Decomposed 4 hours later | Decomposed 5 hours later | Decomposed 30 hours later |
| | Room-temperature shelfing | | Decomposed 1 week later | Decomposed 1 week later | Decomposed 1 week later | Decomposed 1 week later | Remained unchanged for 6 months |

The invention claimed is:

1. An electroless palladium plating bath comprising a palladium compound, at least one complexing agent selected from the group consisting of ammonia and amine compounds, at least one reducing agent selected from the group consisting of phosphinic acid and phosphinate salts, and at least one unsaturated carboxylic acid compound selected from the group consisting of acrylic acid, propiolic acid, crotonic acid, isocrotonic acid, methacrylic acid, citraconic acid, trans-2-butene-1,4-dicarboxylic acid, itaconic acid, tetrolic acid, aconitic acid, muconic acid, sorbic acid, tiglic acid, angelic acid, senecionic acid, glutaconic acid, mesaconic acid, oleic acid, linoleic acid, cinnamic acid, and anhydrides, salts and derivatives thereof.

2. An electroless palladium plating method comprising immersing a workpiece in an electroless palladium plating bath according to claim 1 to form an electroless palladium plating film on said workpiece.

3. The electroless palladium plating bath according to claim 1, wherein said unsaturated carboxylic acid compound is selected from the group consisting of propiolic acid, crotonic acid, isocrotonic acid, methacrylic acid, citraconic acid, trans-2-butene-1,4-dicarboxylic acid, itaconic acid, tetrolic acid, aconitic acid, muconic acid, sorbic acid, tiglic acid, angelic acid, senecionic acid, glutaconic acid, mesaconic acid, oleic acid, linoleic acid, cinnamic acid, and anhydrides, salts and derivatives thereof.

4. The electroless palladium plating bath according to claim 1, wherein a content of the unsaturated carboxylic acid compound is from 0.01 to 10 mol/L.

5. The electroless palladium plating bath according to claim 1, wherein said bath has a pH of 6 to 10.

6. The electroless palladium plating bath according to claim 1, wherein said bath has a pH of 8 to 10.

7. The electroless palladium plating bath according to claim 4, wherein said bath has a pH of 6 to 10.

8. The electroless palladium plating bath according to claim 4, wherein said bath has a pH of 8 to 10.

9. The electroless palladium plating bath according to claim 4, wherein a content of the unsaturated carboxylic acid compound is from 0.01 to 0.5 mol/L.

10. The electroless palladium plating bath according to claim 1, wherein the unsaturated carboxylic acid compound is selected from the group consisting of acrylic acid, propiolic acid, crotonic acid, isocrotonic acid, methacrylic acid, citraconic acid, trans-2-butene-1,4-dicarboxylic acid, itaconic acid, tetrolic acid, aconitic acid, muconic acid, sorbic acid, tiglic acid, angelic acid, senecionic acid, glutaconic acid, mesaconic acid, oleic acid, linoleic acid, cinnamic acid, and anhydrides and salts thereof.

11. The electroless palladium plating bath according to claim 3, wherein the unsaturated carboxylic acid compound is selected from the group consisting of propiolic acid, crotonic acid, isocrotonic acid, methacrylic acid, citraconic acid, trans-2-butene-1,4-dicarboxylic acid, itaconic acid, tetrolic acid, aconitic acid, muconic acid, sorbic acid, tiglic acid, angelic acid, senecionic acid, glutaconic acid, mesaconic acid, oleic acid, linoleic acid, cinnamic acid, and anhydrides and salts thereof.

* * * * *